United States Patent [19]

Chen

[11] 4,329,659

[45] May 11, 1982

[54] FEEDBACK CONTROL OF LASERS IN FIBER OPTIC SYSTEMS

[75] Inventor: Fang-Shang Chen, New Providence, N.J.

[73] Assignee: Bell Telephone Laboratories, Incorporated, Murray Hill, N.J.

[21] Appl. No.: 107,511

[22] Filed: Dec. 27, 1979

[51] Int. Cl.$^3$ ............................................... H01S 3/13
[52] U.S. Cl. ...........................................372/29; 350/96.15
[58] Field of Search ...................... 331/94.5 S, 94.5 H; 350/96.15, 96.20; 250/551, 552, 227

[56] References Cited

U.S. PATENT DOCUMENTS

| | | | |
|---|---|---|---|
| 4,009,385 | 2/1977 | Sell | 331/94.5 S |
| 4,092,061 | 5/1978 | Stigliani, Jr. | 350/96.18 |
| 4,165,496 | 8/1979 | Di Domenico, Jr. et al. | 350/96.15 |

FOREIGN PATENT DOCUMENTS 2328973 7/1975 France .
5078275 1/1977 Japan .

OTHER PUBLICATIONS

"Effects of Beam Displacement and Front and Back Mistracking of Junction Lasers on Lightwave Transmitter Output Stability", by Chen et al., *App. Optics*, vol. 17, No. 14, Jul. 15, 1978.

*Primary Examiner*—William L. Sikes
*Assistant Examiner*—Léon Scott, Jr.
*Attorney, Agent, or Firm*—Michael J. Urbano; David I. Caplan

[57] ABSTRACT

A feedback control arrangement in a fiber optic lightwave transmitter compensates for changes in the average power coupled from a laser into a fiber due to certain displacements of the fiber relative to the laser. The arrangement includes a laser (10) and an optical fiber (28) having a beveled end face (30) oriented to couple a major portion (13) of the laser beam into the fiber. The position of the fiber relative to the beam axis (12) is sensed by a pair of photodetectors (20, 22) positioned on opposite sides of the beam axis so as to receive other portions of the beam (15, 17) not coupled into the fiber. A feedback circuit (24) is selectively responsive to the smaller of the photodetector outputs for controlling the drive current to the laser so as to maintain the average power coupled into the fiber essentially constant.

7 Claims, 3 Drawing Figures

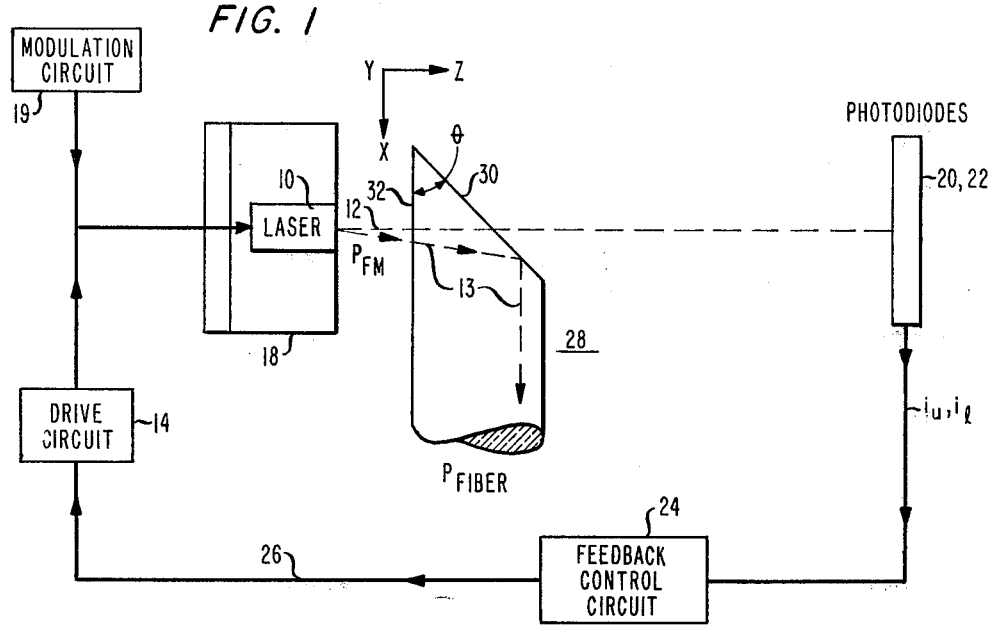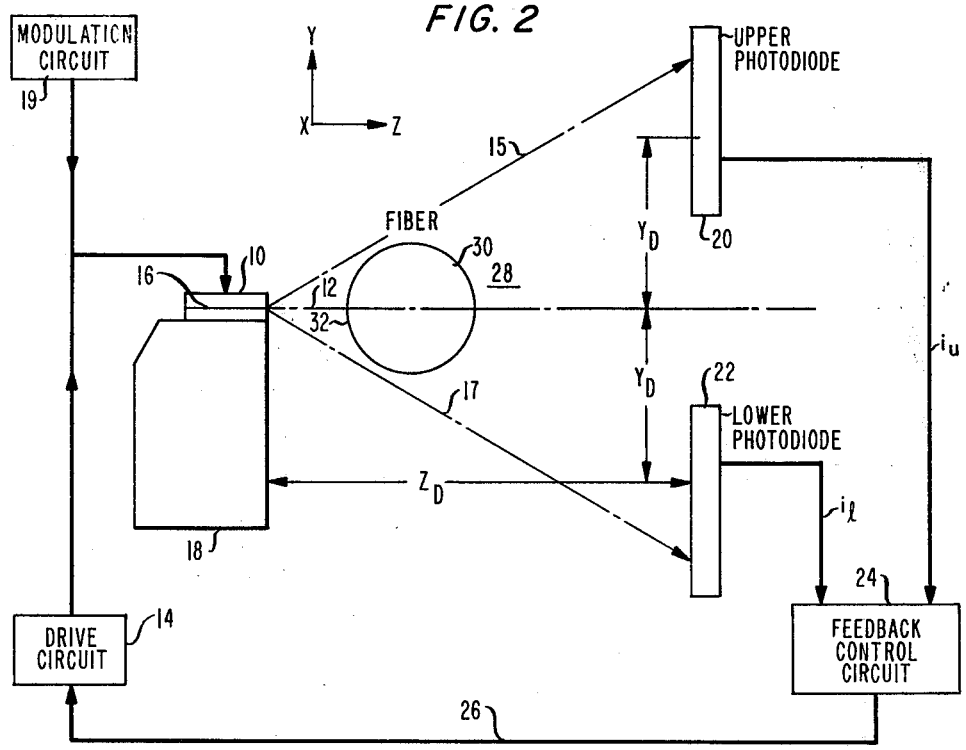

FEEDBACK CONTROL OF LASERS IN FIBER OPTIC SYSTEMS

BACKGROUND OF THE INVENTION

This invention relates to feedback control arrangements for lasers in fiber optic lightwave systems.

For injection lasers to be used as practical signal sources for lightwave communications, the average optical power, as coupled into a transmission fiber, and the peak optical power in the case of digital systems, or the depth of modulation in the case of analog systems, should remain essentially constant as the ambient temperature changes and as the lasers age. If it is assumed that the slope efficiency of the light-current characteristic of the lasers does not change with time or temperature and, in the case of digital systems, that a pseudo-random signal is always present at the laser terminals, then the peak power or the depth of modulation will be constant if the average power is kept constant. One circuit developed for this purpose stabilizes the average output power of the laser by using a p-i-n photodiode to derive a feedback control signal from the back mirror emission of the laser, while the output, coupled directly into the end of a fiber, is taken from the other, or front mirror. This back-mirror monitoring scheme is described by P. W. Shumate et al in *BSTJ*, 57, 1823 (1978).

The causes of instability in fiber output power associated with the back-mirror monitoring scheme were pointed out by F. Chen et al in *Applied Optics*, 17, 2219 (1978). They are: (1) the change of the laser-fiber coupling due to mechanical displacement and/or mode instability of the laser and (2) change in the ratio of powers from the front and back mirrors as the lasers age (front/back mirror mistracking). In order to ensure that the fiber output remains constant, it is necessary to monitor the power in the fiber and use that signal for feedback control.

To monitor the fiber power, an optical tap has been developed by M. DiDomenico et al, U.S. Pat. No. 4,165,496, issued on Aug. 21, 1979. In this tap, a beam splitter is formed by positioning beveled, parallel end faces of two segments of the transmission fiber in coaxial alignment and in close proximity to one another. A photodiode in a feedback circuit detects the portion of light reflected out of the fibers by the beam splitter. Transmitter packages using these taps for feedback control have been built. The burn-in test of these packages indeed showed a significant improvement in the stability of fiber output compared with the back-mirror monitoring scheme. However, since the ratio of fiber output to the tap output is very sensitive to a small laser-fiber misalignment due to the tap's mode selectivity, further improvements in the stability of the fiber output, especially regarding temperature variation, require mode mixers.

A variation of the tap-monitoring scheme is the use of a partially reflecting mirror to tap off part of the laser power from its front-mirror for feedback control. However, because the performance of the transmitter packages depends critically on the optical alignment of lasers, fibers, lenses, and mirrors, and on their mechanical stability in a field environment, any additional optical components may not only increase cost but even possibly degrade reliability of the packages.

In each of the above schemes, laser light is coupled axially into the end of a transmission fiber either directly or through a discrete lens or through a lens formed by shaping the fiber end. However, in U.S. Pat. No. 4,092,061, D. J. Stigliani, Jr., teaches a coupler in which a fiber with a beveled end face is oriented transversely to the laser axis so that the laser beam, which is focused through the cylindrical surface of the fiber, is reflected by the beveled face into the fiber core. Thus, the fiber itself acts as a cylindrical lens for light emitted in the plane normal to the laser junction where the beam divergence is large and, therefore, focusing is needed most for efficient coupling into the fiber; and the beveled end face of the fiber (polished, say, at 45 degrees to the fiber axis) acts as a mirror to reflect the light into the fiber. However, the power coupled into the fiber using this scheme is as sensitive to changes in laser-fiber coupling induced by mechanical motion as is the back-mirror monitoring scheme and the tap-monitoring scheme where no mode mixers are used.

Although a well-designed laser package should allow no relative mechanical motion between the laser and the output fiber, nevertheless these motions do occur.

SUMMARY OF THE INVENTION

In accordance with a primary aspect of my invention, a transverse fiber-laser coupler is incorporated in a lightwave transmitter package capable of monitoring the front-mirror emission of the laser for feedback control, without the need for optical taps or separate lenses and mirrors, and with the ability to maintain constant the optical power coupled into the fiber when certain mechanical displacements of the fiber relative to the laser take place. In one embodiment of my invention, a feedback control arrangement includes: a laser, a pair of photodetectors positioned on opposite sides of the laser beam axis, a cylindrical optical fiber positioned transverse to the beam axis and between the laser and the photodetectors, and a control circuit responsive to the photodetector outputs for generating a feedback signal for maintaining essentially constant the optical power coupled into the fiber. The fiber has a cylindrical surface facing the laser and a beveled end face facing the photodetectors so that a major portion of the beam is coupled through the cylindrical surface and is reflected by the beveled end face into the fiber. Another portion of the beam, which is not coupled into the fiber, is sensed by the photodetectors to generate a pair of electrical signals whose relative magnitudes provide information as to certain displacements of the fiber relative to the beam axis. In a preferred embodiment, the control circuit is responsive only to the smaller of the two signals to increase the excitation applied to the laser, thereby increasing the intensity of the laser beam to compensate for the decrease in laser-fiber coupling due to the displacement. Thus, the optical power coupled into the fiber is maintained essentially constant.

BRIEF DESCRIPTION OF THE DRAWING

My invention, together with its various features and advantages, can be readily understood from the following more detailed description taken in conjunction with the accompanying drawing in which:

FIG. 1 is a schematic of a feedback control arrangement in accordance with one embodiment of my invention as viewed from the top of the laser;

FIG. 2 is similar to FIG. 1 but viewed from the side of the laser; and

DETAILED DESCRIPTION

Figure 3:
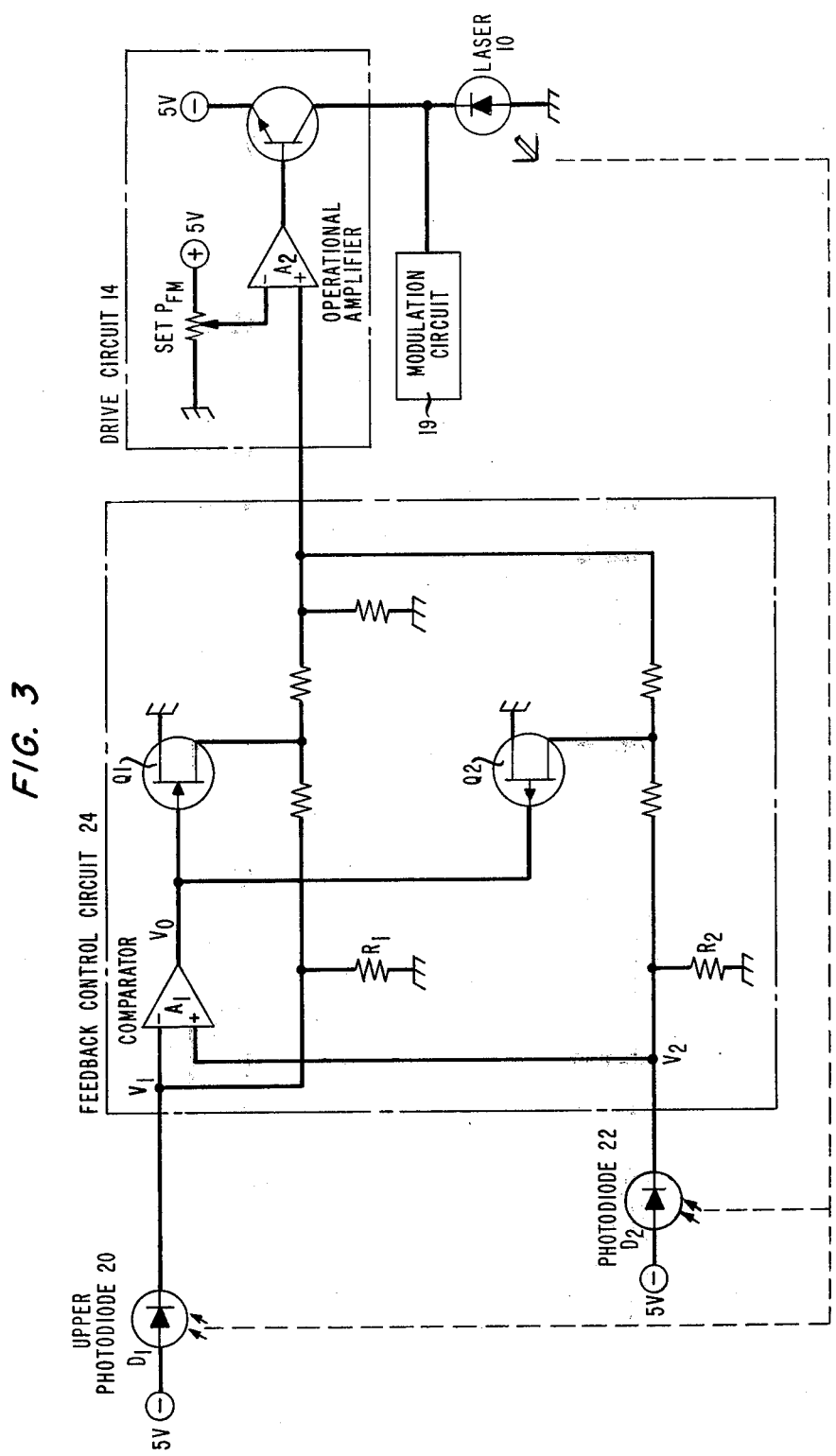
FIG. 3 is a circuit schematic of a drive circuit and a feedback control circuit for use in FIGS. 1 and 2.

With reference now to FIGS. 1 and 2, there is shown, in accordance with an illustrative embodiment of my invention, a feedback control arrangement comprising a laser 10 which emits a light beam along axis 12 when suitable excitation is applied thereto illustratively by means of a drive circuit 14 and a modulation circuit 19. Typically, laser 10 is a semiconductor junction laser having an active region designated 16 (FIG. 2) and is mounted on a suitable heat sink depicted by metallic member 18. A pair of photodetectors 20 and 22, typically photodiodes, are located on opposite sides of axis 12 and are initially positioned so that their photocurrents $i_u$ and $i_l$ are substantially equal to one another. These photocurrents are supplied to a feedback control circuit 24 which compares $i_u$ and $i_l$ and is responsive only to the smaller of these signals. If the fiber moves relative to the beam axis, either $i_u$ or $i_l$ will decrease from its initial magnitude. The difference between the initial and the decreased magnitudes is the error signal and it appears on lead 26. Lead 26 is connected to drive circuit 14 so that the error signal increases the level of excitation supplied to laser 10 by the drive circuit 14 until the error signal approaches zero. The modulation circuit 19 supplies information-carrying modulation current to the laser.

In a fiber optic lightwave system, the beam of laser 10 is coupled into an optical fiber 28 using a transverse laser-fiber coupling scheme. That is, one end of fiber 28 is beveled to form an oblique surface 30 which faces photodiodes 20 and 22. Surface 30 forms an angle 0 to the fiber axis; which is essentially orthogonal to the beam axis 12. Cylindrical surface 32 of fiber 28 faces laser 10 and acts as a lens to focus the laser beam onto oblique surface 30 which, in turn, reflects the beam into the fiber as depicted by light ray 13 of FIG. 1.

While a major portion of the laser beam is thus coupled into fiber 28, another portion of the beam (e.g., rays 15 and 17, FIG. 2) is not coupled into fiber 28 but rather is transmitted to photodiodes 20 and 22 because in the y-z plane the actual laser beam is not totally confined spatially to axis 12, but rather contains rays distributed over a range of angles. For example, in a semiconductor double heterostructure GaAs-GaAlAs laser, the beam typically has a divergence angle of about ±40 degrees perpendicular to the junction plane and about ±8 degrees parallel to the junction plane. In FIGS. 1 and 2, the junction (active region 16) is depicted as lying in the x-z plane.

Assuming that fiber 28 is accurately positioned on the beam axis 12 and that photodiodes 20 and 22 are essentially identical to one another, then the photocurrents $i_u$ and $i_l$ will be essentially equal, to one another if they are positioned equidistant from axis 12 as shown by the dimension $y_D$ in FIG. 2.

If the arrangement were packaged to have a high degree of mechanical stability and if the laser intensity remained constant in time, then the power coupled into the fiber would also remain constant. On the other hand, if the arrangement is not perfectly stable from a mechanical standpoint and the fiber moves in the y direction relative to the laser, then the photocurrents $i_u$ and $i_l$ will no longer be equal, and an error signal will be generated on lead 26 to cause drive circuit 14 to increase the excitation to laser 10, thereby increasing the intensity of the laser beam and maintaining the average power coupled into the fiber essentially constant. In the preferred embodiment, circuit 24 responds to the smaller of the photocurrents $i_u$ and $i_l$ as will be described more fully with respect to FIG. 3.

EXAMPLE

The lasers 10 used in this experiment were 12 μm stripe, proton-bombardment-delineated, GaAs-GaAlAs, double heterostructures bonded on copper heat sink studs 18 as described by R. L. Hartman et al, *APL*, 26, 239 (1975). The beam divergence of these lasers from their peak to $e^{-2}$ in intensity is about +40 degrees in the plane normal to the junction (y-z plane) and +8 degrees in the junction plane (x-z plane). The stud 18 was mounted in a housing (not shown) with a p-i-n photodiode (not shown) to monitor the back-mirror power from the laser 10. Initially, the laser 10 was driven by a dc current source (e.g., in circuit 14) and the total power from the front-mirror ($P_{FM}$) and the photocurrent of the back-mirror photodiode were recorded at discrete values of $P_{FM}$. These measurements provided sufficient data to infer $P_{FM}$ from the back-mirror signal during the laser-fiber coupling experiments when we no longer had direct access to the front mirror. The optical fibers used in these measurements were graded-index fibers with N.A. ≈ 0.23, core diameter ≈ 55 μm and cladding diameter ≈ 110 μm.

The end 30 of the fiber 28 was polished at Θ = 45 degrees from the fiber axis. Although much of the light incident on this beveled surface 30 will be totally reflected into the fiber, it may be preferable to mirror coat the surface 30 to reflect the total spatial distribution of laser emission which may not be totally reflected by the air-glass interface, and also to minimize possible light scattering due to contamination on this surface. Experimentally, we found no significant differences in coupling efficiency between the fibers with and without mirror coating.

The fiber was about 30 cm long and cladding modes were stripped. The laser-fiber coupling was then maximized. We define here the coupling efficiency as $P_{fiber}/P_{FM}$, where $P_{fiber}$ is the power output of the fiber ($P_{FM}$ was set to 2 mW). For purposes of comparison, the coupling efficiency versus relative fiber displacement along the junction plane (x direction) was measured for three types of fiber coupling: the transversely coupled 45 degree beveled fiber 28 as shown in FIGS. 1 and 2; an axially coupled, hemispherically-ended fiber of 55 μm radius; and an axially coupled flat-ended fiber. The fibers were the same except for end preparation. Similar experiments were performed for fiber displacements in the direction normal to the junction plane (y direction).

The experiments indicated that, for both x and y displacements, the measured peak efficiency of the transverse coupling scheme is about 50 percent, whereas that of the axially coupled, hemispherically-ended fiber was 60 percent and of the flat-ended fiber was 40 percent. However, it should be mentioned that the measured coupling efficiencies depend on the actual physical conditions of the fiber end such as cleanliness and sphericity, in addition to the fiber-end geometries. Also, coupling efficiencies of the transverse coupling scheme of FIGS. 1 and 2 are much less sensitive to fiber motion in the z direction and to the fiber rotation around its own axis.

Since the fiber 28 couples only about 50 percent of the laser beam power from the front mirror, there is sufficient light leakage around the fiber to provide a strong signal from a single photodiode (not shown) on the laser axis to a feedback-control circuit. As the fiber 28 moved in the direction normal to the junction (y direction), away from the position of maximum coupling, the photocurrent of the photodiode should have ideally decreased initially so that the feedback circuit would drive the laser harder to restore simultaneously the fiber output and the photocurrent. However, with this single photodiode scheme, the photocurrent at times actually increased (i.e., was of the wrong phase) with the fiber motion depending on the sizes of the fiber, the photodiode, and their separation. The action of the feedback circuit was then to decrease the fiber output further.

In accordance with my invention as depicted in FIGS. 1 and 2, however, the fiber output can be maintained constant even if the fiber moves in the direction normal to the laser junction (y direction), the direction which has the largest sensitivity of laser-fiber coupling to the fiber motion. For instance, as the fiber 28 moves upward from the position of maximum coupling, the photocurrent ($i_l$) from the lower photodiode 22 increases while the photocurrent ($i_u$) from the upper photodiode 20 decreases. The feedback circuit 24 is designed to respond only to the smaller of the two photocurrents so that the laser 10 will be driven harder to compensate for the decrease in laser-fiber coupling. Hence, the output from the fiber 28 can be made to remain essentially unchanged. However, the arrangement does not correct the fiber output for fiber displacements parallel to the laser junction (x direction), and the beam direction (z direction). The former is probably less likely to occur because it is the direction of the fiber axis in the transverse coupling scheme, and the laser-fiber coupling is less sensitive to the latter as will be shown later.

Ideally, one would like to locate the single photodiode at a position so that its photocurrent changes in the same proportion as the fiber output as the fiber moves. Then the feedback circuit would restore the fiber output to its initial magnitude, and the fiber ouput would be insensitive to the laser-fiber displacement. In accordance with my invention, this goal was accomplished, within a certain range of y motion, by the two-photodiode arrangement shown in FIGS. 1 and 2 and the feedback circuit of FIG. 3 which responds only to the smaller of the two photocurrents. To demonstrate the efficacy of the arrangement, a photodiode 20 (diameter=1 mm) was initially placed at $z_D=1$ mm and $y_D=+1.13$ mm (see FIG. 2). The fiber output power $P'_{fiber}$ and the photocurrent from the photodioe 20 were measured versus $\Delta y$. The photodiode was then moved to $z_D=1$ mm and $y_D=-1.13$ mm (i.e., the position where photodiode 22 would be), and the same measurements were repeated. From these measurements, the feedback-corrected fiber outputs $P_{fiber}$ were calculated from $$\frac{P_{fiber}}{P'_{fiber}} = \frac{i_{lo}}{i_l}, \text{ if } i_l < i_u \quad (1)$$

$$\frac{P_{fiber}}{P'_{fiber}} = \frac{i_{uo}}{i_u}, \text{ if } i_u < i_l \quad (2)$$

where the subscript o denotes the magnitude at $\Delta y=0$, and $i_u$ and $i_l$ were the photocurrents of the upper and the lower diodes 20 and 22, respectively. Plots of $P_{fiber}$ versus $\Delta y$ showed that $P_{fiber}$ remained within a few percent of 1 mW for $\Delta y=\pm 10$ μm, whereas the single front mirror photodiode scheme and the scheme without feedback both exhibited 20 percent decreases to 0.8 mW at $\Delta y=\pm 10$ μm. Similarly, my scheme is more stable than transmitters controlled by optical taps without mode mixers ($\approx \pm 15$ percent). The optimum positions of the photodiodes in my arrangement depend on the diameters of the photodiodes and fiber, and they can be found experimentally.

As mentioned previously, my scheme does not correct for changes in $P_{fiber}$ as the fiber moves in the x and z directions. In addition, the fiber motion in these directions could conceivably change the monitored photocurrents adversely if the photodiodes were improperly positioned. With this in mind, we measured $P_{fiber}$ versus $\Delta x$ and $\Delta z$ without and with the feedback correction using the two-photodiode scheme. Since the curves with and without the feedback correction did not deviate significantly from one another, we concluded that the adverse interference between the fiber displacements and the monitored photocurrents was negligible.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

In particular, a feedback circuit 24 and drive circuit 14 for use in my two-photodiode scheme are shown in FIG. 3. The circuit is configured to connect the noninverting (+) input of operational amplifier $A_2$ to whichever photodiode ($D_1$ or $D_2$) is delivering the smaller photocurrent to comparator $A_1$. At the same time, the photodiode with the larger current is grounded through a field-effect transistor ($Q_1$ or $Q_2$).

Let the output voltage of the comparator $A_1$ be $V_o$, then $V_o > 0$, if $V_1 > V_2$ $V_o < 0$, if $V_1 < V_2$ where $V_1 = R_1 i_u$ and $V_2 = R_2 i_l$. $V_o$ is connected to the gates of two transistors $Q_1$ and $Q_2$ as shown. If, for example, $V_o > 0$, then $Q_1$ (e.g., n-channel FET) conducts and $Q_2$ (e.g., p-channel FET) is turned off. Then $V_1$ will be grounded through $Q_1$, while $V_2$ appears at the + terminal of $A_2$. Thus, the feedback loop is closed with $V_2$ (the smaller of the two photodiode outputs) as the input signal. The time constant of $A_2$ must be adjusted to be insensitive to switching operations at $Q_1$ or $Q_2$. Note that the unlabeled resistors are all much greater than $R_1$ or $R_2$.

SUMMARY OF THE INVENTION

We have shown experimentally that bevel-ended, transversely coupled optical fibers have laser-fiber coupling scheme efficiencies comparable with the hemispherically-ended, axially coupled fibers. Its sensitivity to laser-fiber relative displacement parallel to the laser junction plane is similar to the flat-ended fiber and less sensitive compared with the hemispherically-ended fiber, while its sensitivity to the fiber displacement normal to the junction plane is similar to the hemispherically-ended fiber.

More importantly, however, the transverse coupling scheme allows the front-mirror laser emission to be monitored by a pair of photodiodes for the purpose of feedback control without additional optical components such as optical taps, lenses, and mirrors. Thus, the fiber output power can be stabilized even as the laser develops front/back mirror mistracking. The elimination of additional optical components improves the reliability since the alignment of lasers with these optical components is critical.

Comparison of various laser-power monitoring schemes for feedback control regarding their tolerances to laser-fiber relative displacement is shown in the following table. The feedback corrected output power from the fiber was held within ±15 percent as the laser-fiber displacements were changed within the ranges shown. The fiber output power $P_{fiber}$ were assumed to be feedback controlled using the signal from the monitoring photodiodes.

|  | 45 Degree-Ended Fiber Front-Mirror Monitor | | Hemispherically Ended Fiber Back-Mirror Monitor |
| --- | --- | --- | --- |
|  | 1-Photodiode | 2-Photodiode |  |
| $\Delta y(\mu m)$ Perpendicular to Junction | ±8 | ±13 | ±8 |
| $\Delta x(\mu m)$ Parallel to Junction | ±10 | ±10 | ±8 |
| $\Delta z(\mu m)$ | +20 | +20 | +30 |

For the tap-monitoring scheme of DiDomenico et al, supra, without a mode mixer (not shown in the table), $P_{fiber}$ could change by ±15 percent as soon as the fiber moved due to the tap's mode selectivity. However, $P_{fiber}$ would be stable within ±15 percent for a large fiber displacement (~20 μm) at a cost of an increased laser power (to compensate for the decreased laser-fiber coupling) and possibly a shortened laser life. The tolerance to fiber displacement of the 45 degree-ended fiber one-photodiode scheme is substantially the same as the hemispherically-ended fiber back-mirror scheme (columns 1 and 3). But, the range of $\Delta y$ is increased by over 50 percent to ±13 μm with the two-photodiode scheme in accordance with my invention. In fact, $P_{fiber}$ remains practically unchanged for $\Delta y = \pm 10$ μm, which can be accomplished in the tap-monitoring scheme only when the taps were made perfectly mode insensitive.

An added advantage of the bevel-ended fiber compared with the hemispherically-ended fiber is that the former can be polished as a bundle of fibers while the latter requires individual processing. Thus, the bevel-ended fiber should cost less to process.

This application was filed concurrently with another case of mine entitled "Circuit for Stabilizing the Output of an Injection Laser." In some cases, it may be desirable to employ that circuit in conjunction with the arrangement described herein.

I claim:

1. A control arrangement comprising:
    (a) a laser (10) for generating a beam of radiation along a propagation axis (12);
    (b) an optical fiber (28) oriented so as to couple a major portion (13) of said beam into said fiber; and
    (c) feedback means responsive to said beam for changing the excitation to said laser so as to maintain essentially constant the average power coupled into said fiber;
    characterized in that the axis of said fiber is oriented transverse to said propagation axis, whereby a displacement of said fiber in a direction transverse both to said propagation axis and to the fiber axis changes the coupling of said laser beam into said fiber, and said feedback means includes
    (i) a pair of photodetectors, each for generating a different photocurrent proportional to a respective light portion incident thereon, said photodetectors positioned on opposite sides of the plane formed by said axes so that said displacement of the fiber changes the respective said photocurrents proportional to said change in respective light portion incident thereon, and
    (ii) circuit means responsive to said photocurrents for changing the excitation to said laser whenever said displacement of said fiber causes said photocurrents to undergo said changes.

2. The arrangement of claim 1 wherein said photodiodes are essentially identical to one another and are positioned equidistant from said propagation axis.

3. The arrangement of claims 1 or 2 wherein, in an orthogonal 3-dimensional coordinate system having x, y, and z axes, said laser beam is directed along the z axis, said fiber is oriented along the x axis, and said photodiodes are coplanar in the x-y plane.

4. The arrangement of claim 3 wherein said laser comprises a semiconductor laser having an elongated planar active region which is oriented in the z direction and which lies in the x-z plane.

5. The arrangement of claim 4 wherein one end of said fiber has a beveled surface facing said photodiodes and a cylindrical surface facing said laser so that said beam is focused by said cylindrical surface onto said beveled surface which reflects said beam into said fiber.

6. The arrangement of claim 5 wherein said beveled surface makes an angle of approximately 45 degrees with said x and z axes.

7. The arrangement of claim 1 wherein said circuit means is responsive to the smaller of said photocurrents for increasing the excitation to said laser so as to maintain the average power essentially constant in said fiber.

* * * * *